(12) United States Patent
Nagaraj

(10) Patent No.: US 6,522,489 B1
(45) Date of Patent: Feb. 18, 2003

(54) EFFICIENT ANALOG-TO-DIGITAL CONVERTER FOR DIGITAL SYSTEMS

(75) Inventor: Krishnaswamy Nagaraj, Somerville, NJ (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/696,315

(22) Filed: Oct. 25, 2000

Related U.S. Application Data

(60) Provisional application No. 60/171,333, filed on Dec. 21, 1999.

(51) Int. Cl.[7] .................................................. G11B 5/09
(52) U.S. Cl. ............................ 360/32; 360/46; 341/156
(58) Field of Search .............................. 360/32, 46, 65; 341/155, 156, 126

(56) References Cited

U.S. PATENT DOCUMENTS

| | | | |
|---|---|---|---|
| 5,400,189 A | * | 3/1995 | Sato et al. ..................... 360/65 |
| 5,619,539 A | | 4/1997 | Coker et al. |
| 5,808,573 A | | 9/1998 | Shih et al. |
| 5,872,666 A | | 2/1999 | Saiki et al. |
| 5,874,911 A | * | 2/1999 | Kodama ..................... 341/156 |
| 6,046,874 A | * | 4/2000 | Takahashi ..................... 360/65 |

\* cited by examiner

*Primary Examiner*—Alan T. Faber
(74) *Attorney, Agent, or Firm*—J. Dennis Moore; W. James Brady III; Frederick J. Telecky, Jr.

(57) ABSTRACT

An analog-to-digital converter 16 includes first and second analog-to-digital converters 22 and 24 both of which receive an input signal. The first analog-to-digital converter 22 is configured to be centered around a first signal level point while the second analog-to-digital converter 24 is configured to be centered around a second signal level point. A decoder 26 receives inputs from the two analog-to-digital converters 22 and 24 and selects between the first analog-to-digital converter 22 output and the second analog-to-digital converter 24 output.

22 Claims, 2 Drawing Sheets

EFFICIENT ANALOG-TO-DIGITAL CONVERTER FOR DIGITAL SYSTEMS

This application claims priority under 35 USC §119(e)(1) of provisional application No. 60/171,333, filed Dec. 21, 1999.

FIELD OF THE INVENTION

The present invention relates generally to analog-to-digital converters and more particularly to an efficient analog-to-digital converter for digital systems.

BACKGROUND OF THE INVENTION

Digital signal processors are becoming more popular, being used in a wide variety of applications including hard disk drives, cellular phones, modems and others. The digital signal processor typically operates on digital signals that have been derived from analog signals. The conversion from the analog signal to the digital signal is often performed by an analog-to-digital converter (ADC).

A number of techniques have been used to implement an ADC. For example, one type of ADC is the so-called parallel comparator type. In this device, an analog input voltage is applied to a number of comparators, the number being $2^n-1$ where n is the number of digital bits to be generated. Each of the these comparators also receives a different reference voltage that ranges from near the highest voltage that can be expected to the lowest voltage that can be expected. The outputs of each of the comparators can be logically combined to generate the n digital bits.

One application that uses an ADC is a read channel of a disk drive. In this application, digital data is encoded and stored on a disk drive medium. The data must then be read from the drive and processed digital processing circuitry. An analog-to-digital converter is often used generate the digital circuitry that is processed by the digital processing circuitry.

SUMMARY OF THE INVENTION

The present invention provides an efficient analog-to-digital converter for digital systems. This analog-to-digital converter includes a number of advantages over prior art devices.

In a first aspect, an analog-to-digital converter includes first and second analog-to-digital converters both of which receive an input signal. The first analog-to-digital converter is configured to be centered around a first signal level point while the second analog-to-digital converter is configured to be centered around a second signal level point. A decoder receives inputs from the two analog-to-digital converters selected between the first analog-to-digital converter output and the second analog-to-digital converter output.

The concepts of the present invention can be utilized in a number of applications. For example, the read channel of a disk drive might include an analog-to-digital converter. Accordingly, the present invention envisions a novel disk drive system that includes one of the embodiment analog-to-digital converters described herein.

Different aspects of the present invention have advantages over prior art techniques. For example, since the analog-to-digital converter only performs fine resolution digitization at certain signal levels, the converter can be implemented with far fewer transistors. In one example, a prior art analog-to-digital converter that was implemented with sixty-three comparators can now be implemented with only twenty-one comparators. This reduction is the number of components also leads to a reduction in power consumption, a feature that is especially useful in mobile devices such as cellular telephones and mobile computers.

BRIEF DESCRIPTION OF THE DRAWINGS

The above features of the present invention will be more clearly understood from consideration of the following descriptions in connection With accompanying drawings in which.

DETAILED DESCRIPTION OF THE EMBODIMENTS

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

The present invention will first be described with respect to a specific application, namely a disk drive read channel. The basic concepts will then be expanded so that the reader can understand how they can be utilized in other contexts.

Figure 1:
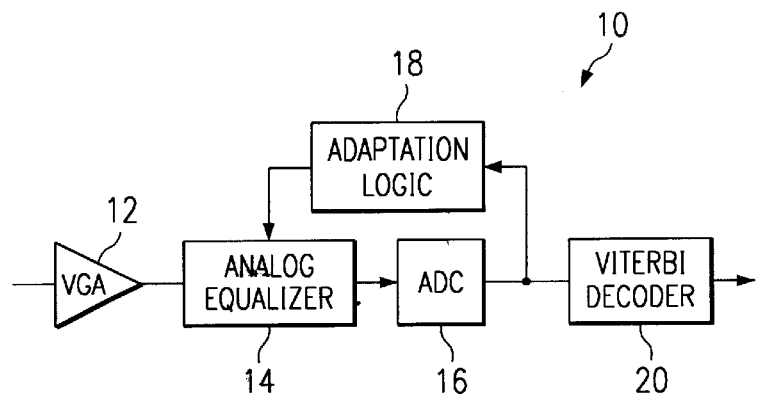
FIG. 1 is a block diagram of a read channel system that utilizes an analog-to-digital converter of the present invention.
Figure 2A:
FIGS. 2a–2d, referred to collectively as FIG. 2. show exemplary waveforms that can be digitized by the analog-to-digital converter of the present invention.
Figure 2B:
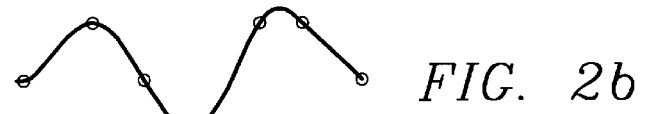
Figure 2C:
Figure 2D:
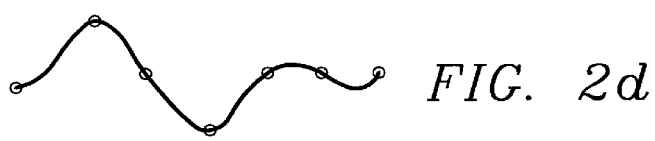

FIG. 1 illustrates a block diagram of a first embodiment system 10 that can be used for a disk drive read channel. In this system, an analog input is applied to variable gain amplifier (VGA) 12. The output of VGA 12 is applied to analog equalizer 14 which is in turn coupled to analog-to-digital converter (ADC) 16. ADC 16 is preferably an ADC as described herein.

The output of ADC 16 is coupled to both adaptation logic 18 and viterbi decoder 20. As shown, the adaptation logic is coupled to analog filter 14. The system 10 can be used as to detect sequences of data read from a disk drive (e.g., magnetic drive, CD or DVD or tape drive). The variable gain amplifier 12 will amplify the signal to the appropriate level and equalizer 14 will equalize the signal levels.

One feature of this architecture is that the equalizer 14 is completely analog. This is a popular trend because analog equalizers are more power efficient than digital finite impulse response (FIR) equalizers. By equalizing the received signal prior to performing the analog to digital conversion, it is more likely that the signal level will be very close to. one of the target signal levels. It is noted, however, that concepts of the present invention could be applied to systems that use digital finite impulse response (FIR) equalizers.

The ADC 16 typically has a resolution of six bits in order to achieve acceptable error rate performance. Therefore, a typical prior art parallel-comparator type ADC would utilize 63 comparators ($2^6-1$). The present invention provides a technique for simplifying the analog-to-digital converter implementation by taking advantage of the unique properties of the disk drive signal.

As a first example, we will assume that the system 10 uses a PR4 signal format, which is an example of a PRML (partial response, maximum likelihood) signal format The present invention would also be applicable to other partial response encoding techniques. The PR4 format is particularly interesting because it is used in many present disk drives (e.g., magnetic disk drives, tape drives; compact disk drives and digital versatile disk drives). The z-domain transfer function of an ideal PR4 channel is $1-z^{-2}$. In other words, each coded bit is determined as the present bit minus the bit of two cycles earlier. An example of a coded bit stream is shown here.

Input: 1 1 0 0 1 0 1 0 0 0 1 1 0 1 1 1 1 0 1 0 0 0 0 1 1 0

PR Output -1 -1 1 0 0 0 -1 0 1 1 -1 0 1 0 0 -1 0 0 -1 0 0 1 1 -1

Some typical output waveforms are shown in FIG. 2.

The code has some properties that can be utilized. First, after the initial convergence of the equalizer and timing recovery, the samples receive by the analog-to-digital converter 16 have only three possible amplitudes, namely 0, +1, or -1. In practice, this is not perfectly true due to noise and imperfect equalization. The amplitude distribution, however, is still within small ranges around these three levels. Thus, one aspect of the present invention proposes to have more comparators around these levels and have fewer comparators in other regions.

The PR code has another useful property. By virtue of the transfer function, there can never be a pattern of the type "+1x+1" or "-1x-1", where x can be anything (i.e., +1, 0, or -1). Thus, if a +1 signal is received, an assumption can be made that the symbol received two clock cycles later will be either a 0 or a -1 (but not another +1). Similarly, if a -1 signal is received, an assumption can be made that the symbol received two clock cycles later will be either a 0 or a +1 (but not another -1).

In fact, this property extends beyond three consecutive bits. Assume, for the sake of explanation, that the data stream can be thought of as including an odd channel and an even channel, such that every other bit is assigned to either the odd channel or the even channel. If so, neither channel can have a +1 (or -1) until it first receives a -1 (or +1), regardless of how many intervening 0 bits are received.

Taking into account these properties, a simplified flash analog-to-digital converter can be constructed. A block diagram of one such system is shown in FIG. 3.

Figure 3:
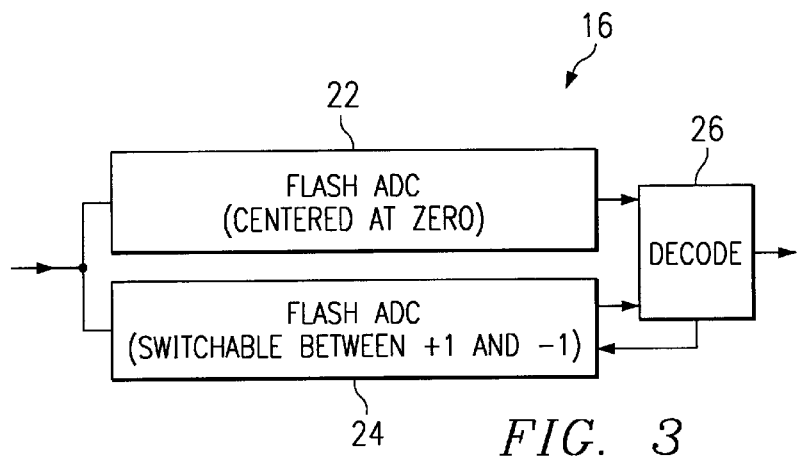
FIG. 3 illustrates a first embodiment analog-to-digital converter of the present invention.

The system of FIG. 3 includes two analog-to-digital converters. The first analog-to-digital converter 22 is centered about zero and the second analog-to-digital converter 24 is switchable to be centered around either +1 or -1. In the preferred embodiment, both of these analog-to-digital converters 22 and 24 are three-bit ADCs. Accordingly, these ADC's will determine the signal level within one of eight levels.

The ADC 22 is preferably a flash analog-to-digital converter centered around the zero level. The comparator levels of this component are equivalent to those of a six-bit ADC. The ADC 24 also includes comparator levels that are equivalent to those of a six-bit ADC. The ADC 24 is preferably a switchable analog-to digital converter that can be switched between +1 and -1 depending on the last non-zero symbol received at the respective odd or even channel. As an example, the decoder 26 could include circuitry (not shown) to control the ADC 24 between +1 and -1.

The outputs of ADC 22 and ADC 24 are each applied to a decoder 26. The decoder will select the output of ADC 22 if the signal level was centered around "0" or will select the output of ADC 24 if the signal level was centered around either "+1" or "-1". The decoder, or other circuitry, will also append higher order bits that represent which signal level (i.e., +1, 0, or -1) was received. The combination of these higher order bits, as well as the bits determined by ADC 22 or ADC 24 will comprise the entire digital representation of the signal level (e.g., in six bits).

Figure 4:
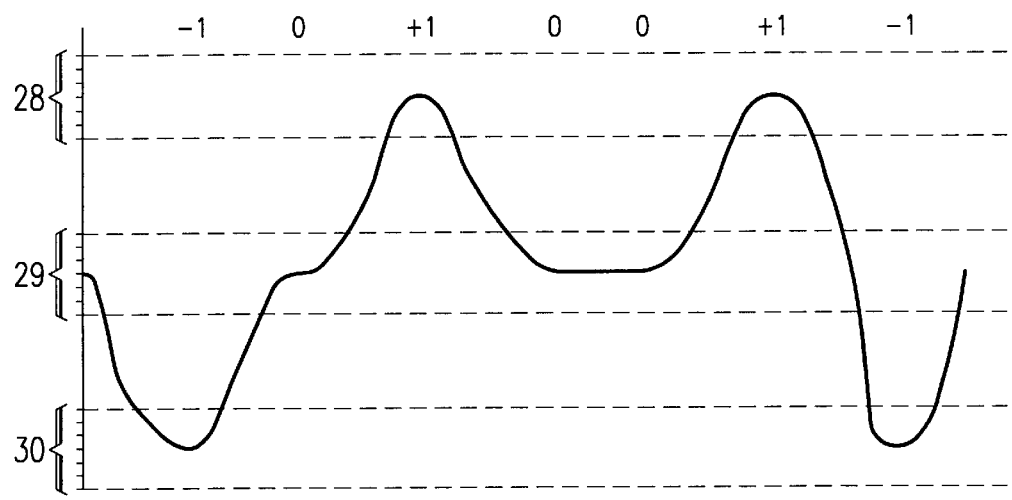
FIG. 4 illustrates a waveform that can be digitized using an analog-to-digital converter of the present invention.

FIG. 4 illustrates an arbitrary signal. As indicated by the hash marks 28, 29 and 30 on the y-axis, the analog-to-digital converters 22 and 24 perform more precise measurements of the signal level within each predetermined window, the window being illustrated by the dashed lines. (It is noted that the figure is not drawn to scale for a six bit analog-to-digital converter.) Since outside knowledge already dictates that the signals will most likely be within those windows, the system avoids the cost of determining the signal level over the entire range.

As an example, assume that the precision of a six-bit ADC is required to measure the signal level. In a traditional flash analog-to-digital converter this measurement would be accomplished using 63 comparators ($2^6-1=63$). The circuit of FIG. 3, which uses two three-bit comparators, only requires fourteen comparators ($2^3-1+2^3-1=14$). In other words this embodiment of the present provides 78% reduction in the number of comparators needed, and also a similar reduction in the power consumed.

At the same time, the circuit of the present invention provides a fine resolution of the signal level measurement. This fine resolution can be used for automatic gain control and clock recovery. These same goals are achieved with less circuitry.

If it is desirable to widen some (or all) of the windows, this goal can easily be accomplished by increasing the number of bits of the fine resolution analog-to-digital converters 22 and 24.

A potential problem exists with the scheme of FIG. 3. If there is an error in detecting a +1 or a -1, the switchable fine flash analog-to-digital converter 24 could be placed in the wrong position two clock cycles later. This error would make the output of the fine flash converter useless during that cycle.

Figure 5:
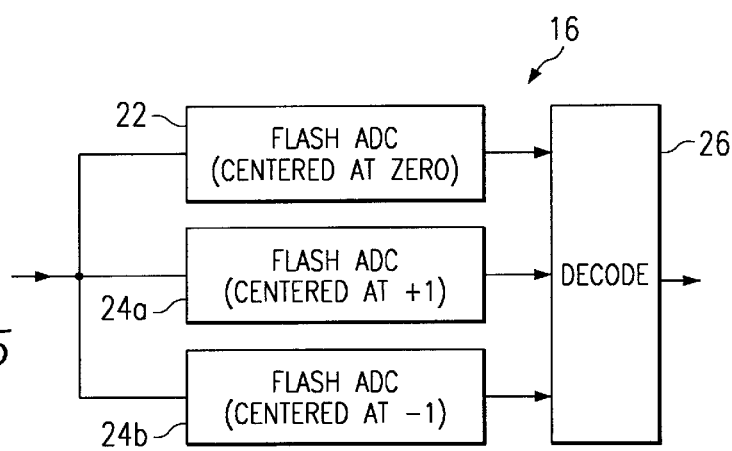
FIG. 5 illustrates a second embodiment analog-to-digital converter of the present invention.

One solution to this potential problem is to include separate ADCs centered around the signal levels for +1 and -1. Such a scheme is illustrated in FIG. 5. In this scheme three ADCs 22, 24a and 24b are utilized. While this scheme uses fifty percent more comparators, it also eliminates the need to have any knowledge of what the bit might be. In other words, this architecture can be used with any encoding scheme.

In fact, the scheme of FIG. 5 could be used with any arbitrary binary digital stream by simply removing the analog-to-digital converter 24b. So long at the system does not require any precise information about the signal levels during transitions, the system could precisely determine signal levels at the 0 and 1 levels.

Figure 6:
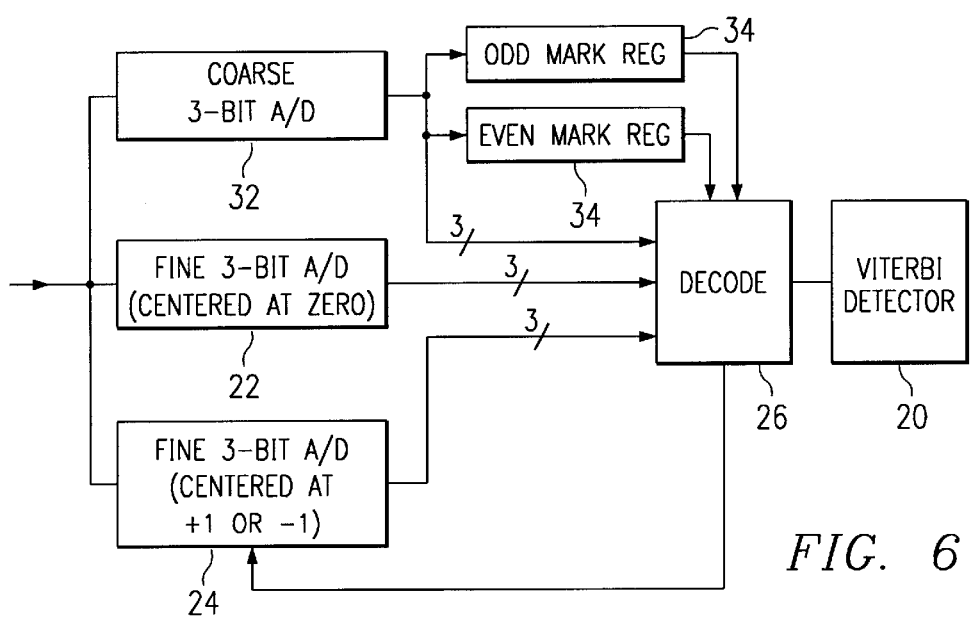
FIG. 6 illustrates a third embodiment analog-to-digital converter of the present invention.

An alternate embodiment of the present invention is shown in FIG. 6. This embodiment is similar to the one shown in FIG. 3 in that it includes a fine flash ADC 32 centered around zero and a switchable fine flash ADC 24 that can be switched between +1 and -1. This embodiment also includes a coarse three-bit flash analog-to-digital converter 32 that covers the entire signal range. The coarse ADC 32 is included so that in cases where there are large errors, e.g., noise created errors, the system does not suffer a complete loss of information.

The circuit of FIG. 6 also includes an odd mark register 34 and an even mark register 36. These registers are provided to remember whether the last non-zero bit was a +1 or a −1. This information is determined from the coarse ADC 32 and is provided to the decode circuitry 26. The decode circuitry 26 further supplies this information back to the switchable ADC 24.

In this embodiment, the decoder 26 could output six bits. The most significant three bits could be passed through from the coarse analog-to-digital converter 32 and the least significant three bits could be passed through from either analog-to-digital converter 22 or analog-to-digital converter 24 depending upon the level of the signal being digitized. The determination of which fine analog-to-digital converter output 22 or 24 to pass through could be made by utilizing the information from the coarse analog-to-digital converter 32.

Although not shown in the figures, the embodiment of FIG. 6 could be modified by converting the switchable analog-to-digital converter 24 into two analog-to-digital converters 24a and 24b as was shown in FIG. 5. In the example where the analog-to-digital converter 24 is a three-bit ADC, this modification would add seven comparators. But the twenty-eight comparators of that circuit would still be significantly fewer than a full six-bit analog-to-digital converter that requires 63 comparators.

The present invention can be modified in a number of ways. For example, the fine analog-to-digital converters 22 and 24, or coarse analog-to-digital converter 32, could generate more than or fewer than three bits. For example, a system that included a three bit coarse ADC 32 and two four-bit fine ADCs 22 and 24 would use only thirty seven comparators, still a greater than forty percent improvement over a full six-bit ADC. Many other combinations could alternatively be used depending upon the system's requirements.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog-to-digital converter having an input node and an output node, the analog-to-digital converter comprising:
    a first analog-to-digital converter configured to be centered around a first point, the first analog-to-digital converter receiving an input signal;
    a second analog-to-digital converter configured to be centered around a second point, the second analog-to-digital converter receiving said input signal; and
    a decoder including a first input coupled to an output of the first analog-to-digital converter and a second input coupled to an output of the second analog-to-digital converter, the decoder selecting between the first analog-to-digital converter output and the second analog-to-digital converter output.

2. The analog-to-digital converter of claim 1 wherein the second analog-to-digital converter is switchable to be centered around either the second point or a third point.

3. The analog-to-digital converter of claim 2 where the determination of whether the second analog-to-digital converter is centered around the second point or the third point is made by examining a previously received signal value.

4. The analog-to-digital converter of claim 1 wherein the first and second analog-to-digital converters comprise n-bit analog-to-digital converters, the analog-to-digital converter further comprising a coarse m-bit analog-to-digital converter, so that the output of the analog-to-digital converter comprises the output of the decoder and the output of the coarse analog-to-digital converter.

5. The analog-to-digital converter of claim 1 and further comprising a third analog-to-digital converter configured to be centered around a third point, the third analog-to-digital converter receiving said input signal.

6. The analog-to-digital converter of claim 1 wherein the analog-to-digital converter is a component in a hard drive read channel, the input node of the analog-to-digital converter being coupled to an output of an analog equalizer.

7. The analog-to-digital converter of claim 6 wherein the output node of the analog-to-digital converter is coupled to an input of a viterbi decoder.

8. A method of digitizing an analog signal, the method comprising:
    providing an analog signal that ranges from a first signal level to a second signal level;
    creating a first digital signal by digitizing a first portion of the analog signal, the first portion of the analog signal covering a range that encompasses less than the range from the first signal level to the second signal level; and
    creating a second digital signal by digitizing a second portion of the analog signal, the second portion of the analog signal covering a range that is different than the range encompassed by the first portion but is also less than the range from the first signal level to the second signal level; and
    selecting between the first digital signal and the second digital signal.

9. The method of claim 8 wherein the analog signal comprises a partial response encoded signal.

10. The method of claim 9 wherein the analog signal is encoded such that the analog signal is near a level of +1, 0, or −1 such that if a first signal bit is encoded at a first non-zero encoded signal level then a next non-zero signal bit received an even number of clock cycles later cannot be at the same level as the first non-zero encoded signal level.

11. The method of claim 8 wherein the analog signal is encoded using a partial response encoding scheme.

12. The method of claim 11 wherein the analog signal is encoded using a scheme that includes three encoded signal levels.

13. The method of claim 8 and further comprising creating a coarse digital signal by digitizing the analog signal between the first signal level and the second signal level.

14. An analog-to-digital converter comprising:
    an analog input node to receive an analog signal that ranges from a first signal level to a second level;
    a coarse m-bit analog-to-digital converter configured to digitize the analog signal from the first signal level to the second signal level;
    a fine n-bit analog-to-digital converter centered around a "0" signal level, the fine n-bit analog-to-digital converter configured to digitize a portion of the analog signal around the "0" signal level;
    a fine switchable n-bit analog-to-digital converter that is switchable to be centered around either a "+1" signal level or a "−1" signal level, the fine switchable n-bit analog-to-digital converter configured to digitize a portion of the analog signal around either the "+1" signal level or the "−1" signal level;

a decoder receiving a first digitized portion of the analog signal from the fine n-bit analog-to-digital converter and receiving a second digitized portion of the analog signal from the fine switchable n-bit analog-to-digital converter, the decoder generating an output signal that comprises either the first digitized portion of the analog signal or the second digitized portion of the analog signal; and a digital output node for carrying the output of the coarse m-bit analog-to-digital converter and the output signal from the decoder.

15. The analog-to-digital converter of claim 14 wherein the analog signal is encoded with digital data.

16. The analog-to-digital converter of claim 14 wherein the output signal of the coarse analog-to-digital converter is used by the decoder to select between the first digitized portion of the analog signal and the second digitized portion of the analog signal.

17. The analog-to-digital converter of claim 14 wherein the coarse m-bit analog-to-digital converter comprises a three-bit analog-to-digital converter and the fine n-bit analog-to-digital converter and the fine switchable n-bit analog-to-digital converter both comprise three bit analog-to-digital converters.

18. The analog-to-digital converter of claim 14 wherein the analog signal is encoded with a partial response, maximum likelihood encoding scheme.

19. A read channel for a disk drive comprising:

a variable gain amplifier;

an analog equalizer with a first input coupled to an output of the variable gain amplifier;

an analog-to-digital converter with an input coupled to an output of the analog equalizer, the analog-to-digital converter comprising a first analog-to-digital converter centered around a first point and a second analog-to-digital converter centered around a second point, both the first and second analog-to-digital converters receiving an input signal from the analog equalizer, the analog-to-digital converter further including a decoder selecting between either an output of the first analog-to-digital converter or an output of the second analog-to-digital converter;

adaptation logic coupled between the output of the analog-to-digital converter and a second input of the analog equalizer; and a decoder with an input coupled to the output of the analog-to-digital converter.

20. The read channel of claim 19 wherein the second analog-to-digital converter is switchable to be centered around either the second point or a third point.

21. The read channel of claim 19 wherein the first and second analog-to-digital converters comprise n-bit analog-to-digital converters, the analog-to-digital converter further comprising a coarse m-bit analog-to-digital converter, so that the output of the analog-to-digital converter comprises the output of the decoder and the output of the coarse analog-to-digital converter.

22. The analog-to-digital converter of claim 19 wherein the decoder comprises a viterbi decoder.

* * * * *